United States Patent
Srinivasan et al.

(10) Patent No.: US 10,360,331 B2
(45) Date of Patent: Jul. 23, 2019

(54) SCOPED SIMULATION FOR ELECTROSTATIC DISCHARGE PROTECTION VERIFICATION

(71) Applicant: Mentor Graphics Corporation, Wilsonville, OR (US)

(72) Inventors: Sridhar Srinivasan, Tualatin, OR (US); Mark E. Hofmann, Portland, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 159 days.

(21) Appl. No.: 15/420,464

(22) Filed: Jan. 31, 2017

(65) Prior Publication Data

US 2018/0218101 A1    Aug. 2, 2018

(51) Int. Cl.
    *G06F 17/50*    (2006.01)
(52) U.S. Cl.
    CPC .................. *G06F 17/5036* (2013.01)
(58) Field of Classification Search
    USPC ......................................................... 716/107
    See application file for complete search history.

(56) References Cited

U.S. PATENT DOCUMENTS

| | | | |
|---|---|---|---|
| 9,189,582 B2 | 11/2015 | Srinivasan et al. | |
| 2006/0194382 A1* | 8/2006 | Hayashi | G06F 17/5036 438/197 |
| 2008/0104554 A1* | 5/2008 | Kobayashi | G06F 17/5036 716/112 |
| 2011/0320990 A1 | 12/2011 | Srinivasan | |
| 2016/0063172 A1 | 3/2016 | Lee | |

OTHER PUBLICATIONS

M. Hogan, et al., "Using Static Voltage Analysis and Voltage-Aware DRC to Identify EOS and Oxide Breakdown Reliability Issues", Electrical Overstress/Electrostatic Discharge Symposium (EOS/ESD), 2013 35th, Las Vegas, Sep. 10-12, 2013, IEEE.
Lescot, J., et.al. "Static Low Power Verification at Transistor Level for SoC Design," International Symposium on Low Power Electronics and Design (ISLPED) 2012, Jul. 2012.
Dina Medhat, "Electrical Overstress Detection and Debugging", EETimes, Aug. 19, 2015.

(Continued)

*Primary Examiner* — Bryce M Aisaka

(57) ABSTRACT

Aspects of the disclosed technology relate to techniques of scoped simulation-based ESD verification. ESD (electrostatic discharge) protection devices and I/O (input/output) circuitry are identified in a circuit design. Static simulation is performed on the I/O circuitry to determine voltage and current information for devices on current paths in the I/O circuitry based on point-to-point resistance values. Transient simulation is then performed on one or more of the ESD protection devices in the devices based on the voltage and current information and detailed parasitic information. The point-to-point resistance values and the detailed parasitic information are extracted based on a layout design for the circuit design and cross-reference information between circuit component identifiers and layout features. Results of the transient simulation are analyzed to identify ESD protection problems.

19 Claims, 7 Drawing Sheets

Flow chart
400

(56) References Cited

OTHER PUBLICATIONS

Dina Medtat, "Reliability approaches for automotive electronic systems", in "Reliability Characterisation of Electrical and Electronic Systems", ed. By J. Swingler, 1st Edition, ElSevier (Woodhead Publishing), 2015.

Lescot, J., et.al. "A comprehensive ESD verification flow at transiistor level for large SOC designs," Electrical Overstress/Electrostatic Discharge Symposium (EOS/ESD), 2015 37th.

Dina Medhat, "Ensuring design reliability with design patterns", www.eejournal.com, Sep. 26, 2013.

Greg Hackney, "The future of IC design verification," www.electroniproducts.com, Nov. 1, 2010.

Volker Meyer zu Bexten et al., "Physical verification flow for hierarchical analog IC design constraints," Design Automation Conference (ASP-DAC), 2015 20th Asia and South Pacific.

Dina Medhat, "Power-aware verification in low-power ICs", www.chipdesignmag.com, Sep. 4, 2012.

Dina Medhat, "Improving reliability", semiengineering.com, Sep. 13, 2012.

\* cited by examiner

SCOPED SIMULATION FOR ELECTROSTATIC DISCHARGE PROTECTION VERIFICATION

FIELD OF THE DISCLOSED TECHNOLOGY

The present disclosed technology relates to the field of circuit design verification. Various implementations of the disclosed technology may be particularly useful for electrostatic discharge (ESD) protection verification.

BACKGROUND OF THE DISCLOSED TECHNOLOGY

Electrostatic charge is defined as "electric charge at rest". Static electricity is an imbalance of electrical charges within or on the surface of a material. This imbalance of electrons produces an electric field that can be measured and that can influence other objects. Electrostatic discharge (ESD) is defined as the rapid, spontaneous transfer of electrostatic charge induced by a high electrostatic field. Electrostatic discharge can change the electrical characteristics of a semiconductor device, degrading or destroying it. As electronic devices become faster and smaller, their sensitivity to electrostatic discharge in general increases. This trend may be accelerating.

An ESD event will force a current pulse from few hundred milliamps to several tens of amps into the integrated circuit for a time period ranging from few nanoseconds to several microseconds. Typical power levels that need to be dissipated during an ESD event are on the order of several tens of watts. An ESD protection circuit can be used to shunt the ESD current through the unpowered IC along the intended ESD protection path, while clamping the voltage at a safe level, without causing any IC functional performance degradation. An ESD protection mechanism should therefore have the ability to protect the circuit and the components to which it is connected. This may include a fast turn-on of ESD protection device, which minimizes the voltage clamping level, and shunts ESD energy away from the protected circuit area.

To ensure a robust ESD protection design, ESD protection evaluation and verification needs to be done at every stage of an overall integrated circuit design flow. Today's electronic design automation tool landscape offers a wide range of options for rule-based ESD verification. For example, designers may identify the protection schemes, write a pattern template for each protection scheme as an input for a verification tool and run the verification tool to automatically identify whether these patterns are present on all input/output pads in a design.

Rule-based ESD verification can provide relatively fast analysis of an ESD protection design. As technology scaling continues, meeting product ESD targets becomes more challenging and requires a more comprehensive ESD verification methodology, however. In particular, time-domain analysis of ESD design cases requires simulation-based ESD verification. On the other hand, full-circuit simulation in SPICE (Simulation Program with Integrated Circuit Emphasis) is impractical given the large sizes of modern IC designs. It is also challenging for simulation-based ESD verification to utilize the vast amount of layout data present in a large design, which can lead to a more accurate and comprehensive analysis.

BRIEF SUMMARY OF THE DISCLOSED TECHNOLOGY

Aspects of the disclosed technology relate to techniques of scoped simulation-based ESD verification. In one aspect, there is a method comprising: identifying ESD (electrostatic discharge) protection devices and I/O (input/output) circuitry in a circuit design, wherein the circuit design comprises a netlist and a layout design; performing static simulation on the I/O circuitry to determine voltage and current information for devices on current paths in the I/O circuitry based on point-to-point resistance values, wherein the point-to-point resistance values are extracted based on the layout design; performing transient simulation on one or more of the ESD protection devices in the devices based on the voltage and current information and detailed parasitic information, wherein the detailed parasitic information is extracted based on the layout design; analyzing results of the transient simulation to identify ESD protection problems; and reporting the ESD protection problems.

The identifying may employ design pattern matching. The transient simulation may be based on SPICE (Simulation Program with Integrated Circuit Emphasis) simulation. The analyzing may comprise analyzing turn-on sequences of multi-finger devices in an ESD protection device. The current paths may comprise ESD discharge paths.

The netlist may be derived from the layout design. Alternatively, the netlist may be derived from a schematic design and the point-to-point resistance values and the detailed parasitic information may be extracted based further on cross-reference information between circuit component identifiers and layout features.

In another aspect, there is one or more computer-readable media storing computer-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

General Considerations

Figure 1:
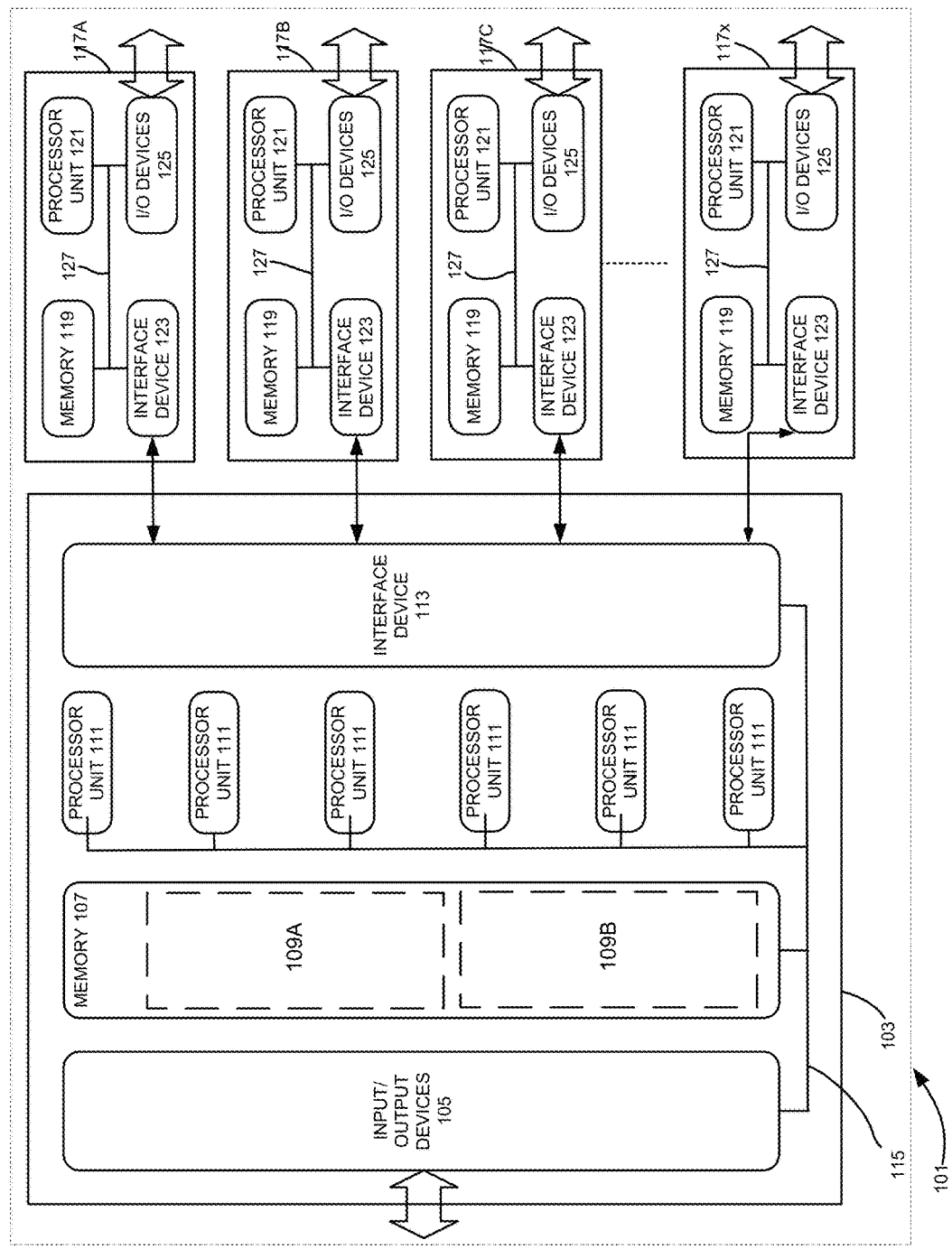
FIG. 1 illustrates an example of a computing system that may be used to implement various embodiments of the disclosed technology.

Various aspects of the present disclosed technology relate to techniques of scoped simulation-based ESD verification. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "perform", "identify" and "analyze" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one micro device, such as data to be used to form multiple micro devices on a single wafer.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

With some implementations of the disclosed technology, the master computing device 103 may employ one or more processing units 111 having more than one processor core.

Figure 2:
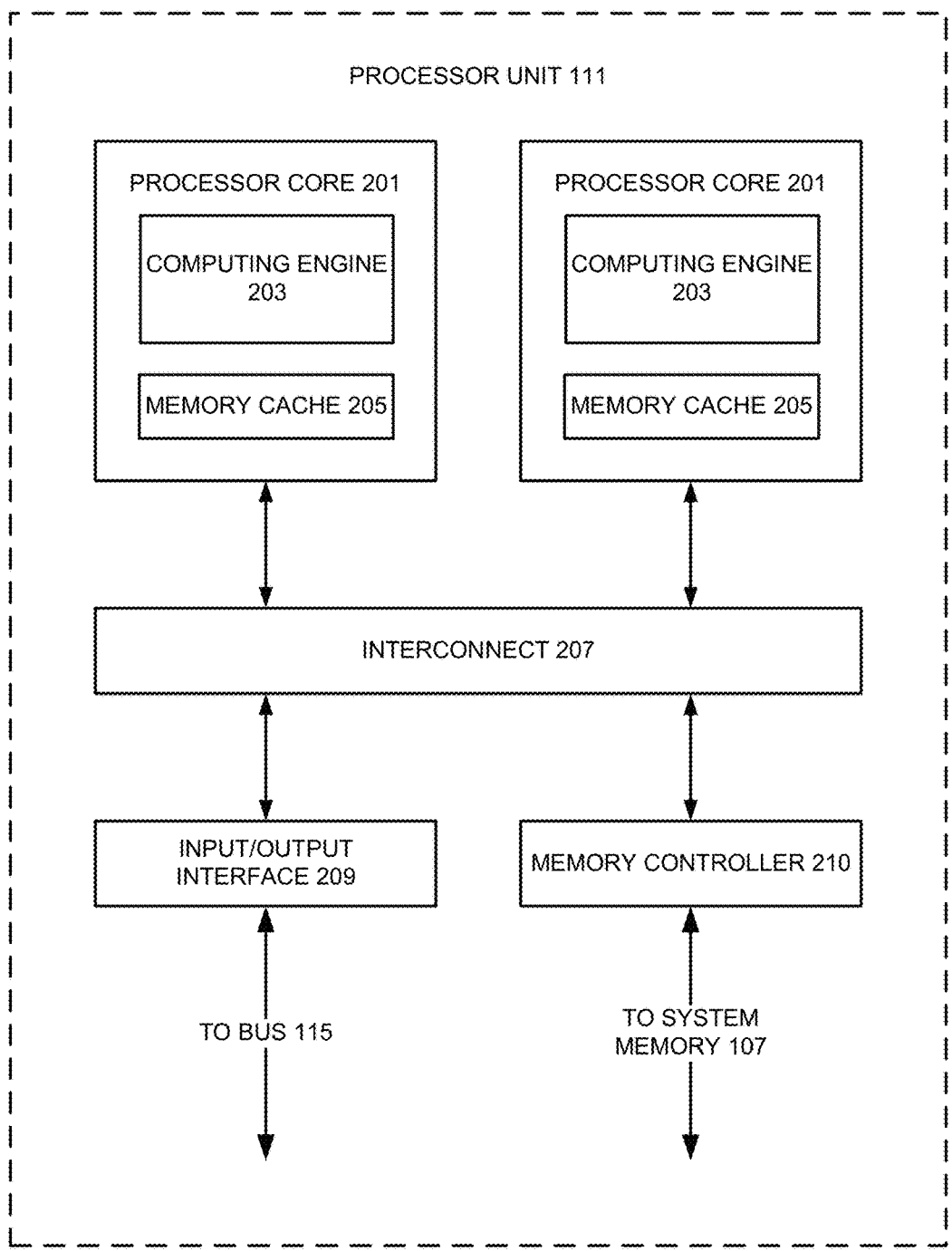
FIG. 2 illustrates an example of a multi-core processor unit that may be used to implement various embodiments of the disclosed technology.

Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory accessible shared by the processor cores 201.

While FIG. 2 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Design Flow and Reliability Verification

Electronic circuits, such as integrated microcircuits, are used in a variety of products, from automobiles to microwaves to personal computers. Designing and fabricating integrated circuit devices typically involves many steps, sometimes referred to as a "design flow." The particular steps of a design flow often are dependent upon the type of integrated circuit, its complexity, the design team, and the integrated circuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing circuit device components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

Integrated circuit layout descriptions can be provided in many different formats. The Graphic Data System II (GDSII) format is a popular format for transferring and archiving two-dimensional graphical IC layout data. Among other features, it contains a hierarchy of structures, each structure containing layout elements (e.g., polygons, paths or polylines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in IC layout designs that are employed to manufacture integrated circuits. Once the microcircuit device design is finalized, the layout portion of the design can be used by fabrication tools to manufacture the device using a photolithographic process.

Process variations and technical limitations of the lithography techniques can make it difficult or even impossible to print some layout features. To achieve a high overall yield and reliability for the design, the layout is measured by a set of geometric constraints, or design rules, specific to a particular lithographic process before tapeout. Design rule checking is thus a major step during physical verification signoff on the design. Still further, the layout design may be modified to include the use of redundant geometric elements or the addition of corrective features to various geometric elements, to counteract limitations in the manufacturing process, etc. For example, the design flow process may include one or more resolution enhancement technique (RET) processes (e.g., optical proximity correction), that modify the layout design data to improve the usable resolution of the reticle or mask created from the design in a photolithographic manufacturing process.

Circuit designs and layout designs are also reviewed for reliability issues caused by the electrical system. This is sometimes referred to as reliability verification. Reliability verification can include reviewing the design for protection from electrostatic discharge (ESD) events, detecting electrical overstress (EOS) situations, performing voltage-aware design rule checking (VDRC), or the like.

ESD Verification Tool

Figure 3:
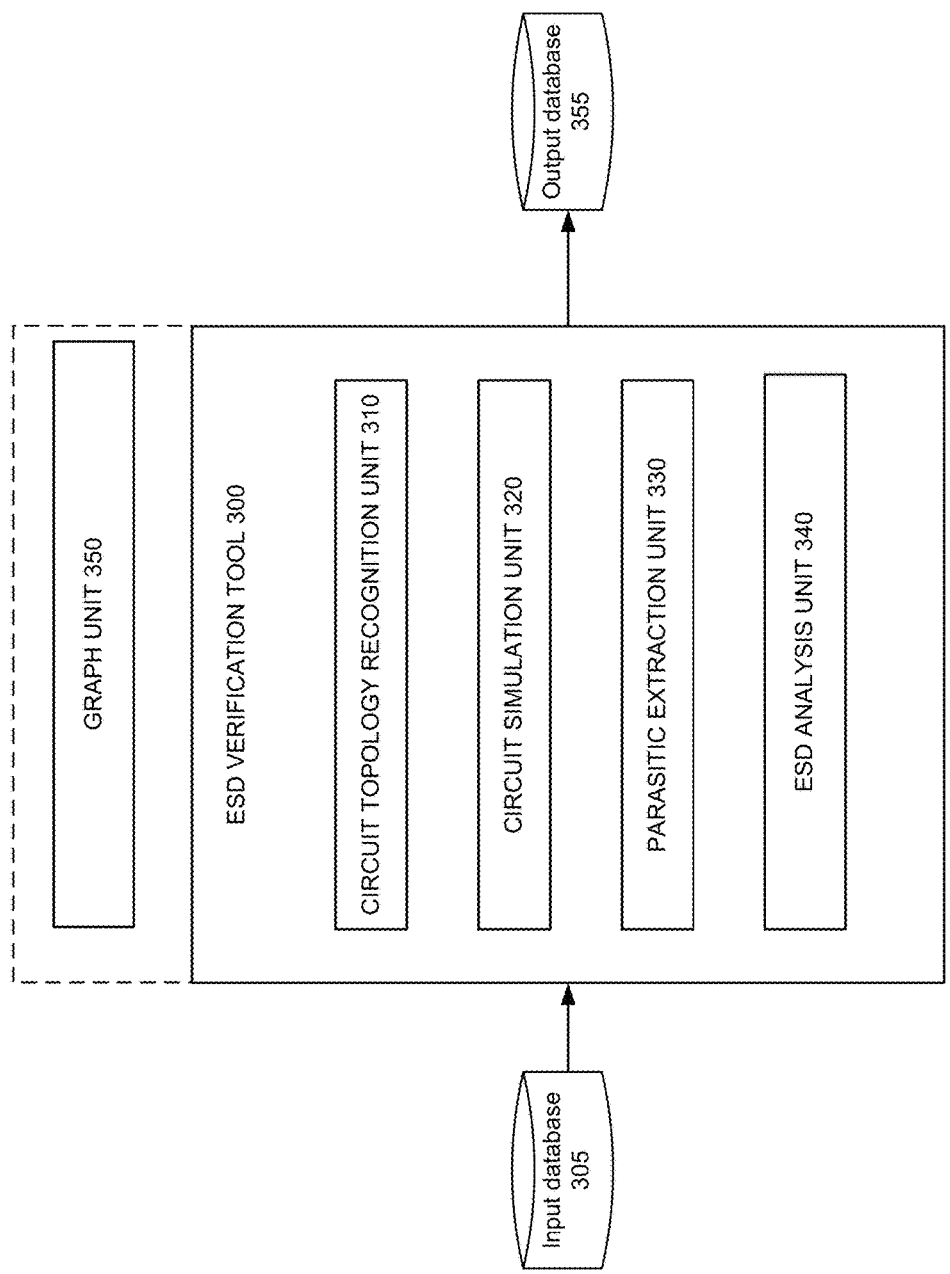
FIG. 3 illustrates an example of an ESD verification tool according to various embodiments of the disclosed technology.

FIG. 3 illustrates an example of an ESD verification tool 300 to perform ESD verification that may be implemented according to various embodiments of the disclosed technology. As seen in this figure, the ESD verification tool 300 includes a circuit topology recognition unit 310, a circuit simulation unit 320, a parasitic extraction unit 330 and an ESD analysis unit 340. Some implementations of the ESD verification tool 300 may cooperate with (or incorporate) one or more of a graph unit 350, an input database 305 and an output database 355.

As will be discussed in more detail below, the ESD verification tool 300 can receive a circuit design from the input database 305. The circuit design comprises a netlist, a layout design and cross-reference information between circuit component identifiers and layout features. The circuit topology recognition unit 310 identifies ESD protection devices and I/O (input/output) circuitry in a circuit design. The circuit simulation unit 320 performs static simulation on the I/O circuitry to determine voltage and current information for devices on current paths in the I/O circuitry based on point-to-point resistance values. The point-to-point resistance values are extracted by the parasitic extraction unit 330 based on the layout design and the cross-reference information between circuit component identifiers and layout features. The circuit simulation unit 320 then performs transient simulation on one or more of the ESD protection devices in the devices based on the voltage and current information and detailed parasitic information. The detailed parasitic information is also extracted by the parasitic extraction unit 330 based on the layout design and the cross-reference information between circuit component identifiers and layout features. The ESD analysis unit 340 analyzes results of the transient simulation to identify ESD protection problems. The ESD verification tool 300 can report the ESD protection problems. The reporting may comprise storing in the output database 355 and/or displaying by the graph unit 350, information about the ESD protection problems.

As previously noted, various examples of the disclosed technology may be implemented by one or more computing systems, such as the computing system illustrated in FIGS. 1 and 2. Accordingly, one or more of the circuit topology recognition unit 310, the circuit simulation unit 320, the parasitic extraction unit 330, the ESD analysis unit 340 and the graph unit 350 may be implemented by executing programming instructions on one or more processors in one or more computing systems, such as the computing system illustrated in FIGS. 1 and 2. Correspondingly, some other embodiments of the disclosed technology may be implemented by software instructions, stored on a non-transitory computer-readable medium, for instructing one or more programmable computers/computer systems to perform the functions of one or more of the circuit topology recognition unit 310, the circuit simulation unit 320, the parasitic extraction unit 330, the ESD analysis unit 340 and the graph unit 350. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the circuit topology recognition unit 310, the circuit simulation unit 320, the parasitic extraction unit 330, the ESD analysis unit 340 and the graph unit 350 are shown as separate units in FIG. 3, a single computer (or a single processor within a master computer) or a single computer system may be used to implement all of these units at different times, or components of these units at different times.

With various examples of the disclosed technology, the input database 305 and the output database 355 may be implemented using any suitable computer readable storage device. That is, either of the input database 305 and the output database 355 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 305 and the output database 355 are shown as separate units in FIG. 3, a single data storage medium may be used to implement some or all of these databases.

Hybrid ESD Verification

Figure 4:
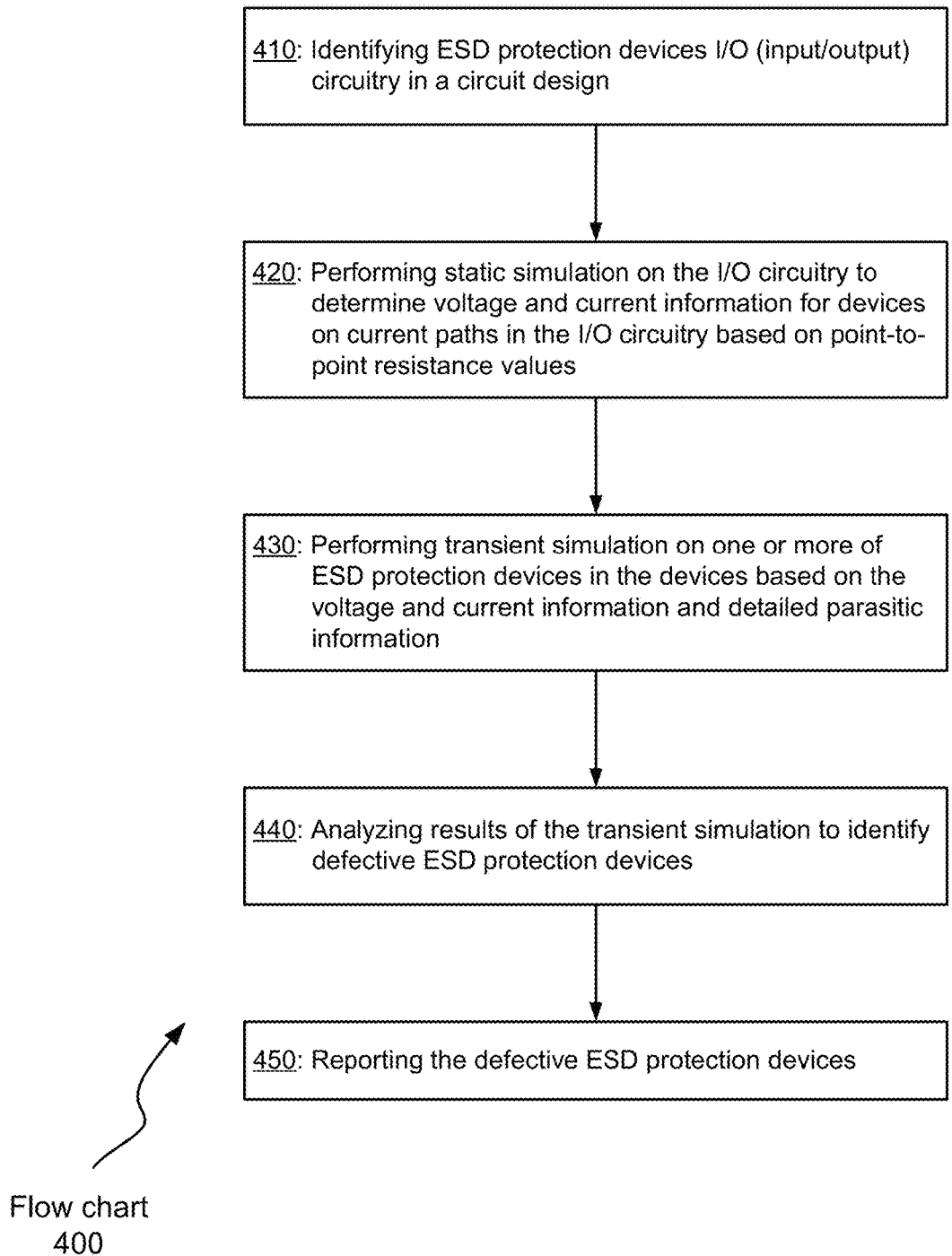
FIG. 4 illustrates a flowchart showing a process for scoped simulation-based ESD verification that may be implemented according to various examples of the disclosed technology.

FIG. 4 illustrates a flowchart 400 showing a process of ESD verification that may be implemented according to various examples of the disclosed technology. For ease of understanding, methods of ESD verification that may be employed according to various embodiments of the disclosed technology will be described with reference to the ESD verification tool 300 in FIG. 3 and the flow chart 400 illustrated in FIG. 4. It should be appreciated, however, that alternate implementations of an ESD verification tool 300 may be used to perform the methods of ESD verification illustrated by the flow chart 400 according to various embodiments of the disclosed technology. Likewise, the ESD verification tool 300 may be employed to perform other methods of ESD verification according to various embodiments of the disclosed technology.

In operation 410, the circuit topology recognition unit 310 identifies ESD protection devices and I/O (input/output) circuitry in a circuit design. The circuit design comprises a logic circuit design such as a netlist and a physical layout design. The netlist may be derived from the layout design. Alternatively, the netlist may be derived from a schematic design. The cross-reference information between logic identifiers and layout features may be generated according to methods disclosed in U.S. patent application Ser. No. 13/017,788, which is incorporated herein by reference.

The ESD protection devices may be identified based on design pattern matching: comparing component patterns in the circuit design with design patterns that represent. For example, a SPICE pattern template that describes a power clamp (sometimes also referred to as a voltage clamp) may be provided to the ESD verification tool 300 by a user. The circuit topology recognition unit 310 can search the design for matching patterns. The identified ESD devices, I/O pads, and power supply pads form ESD discharge paths.

Figure 5:
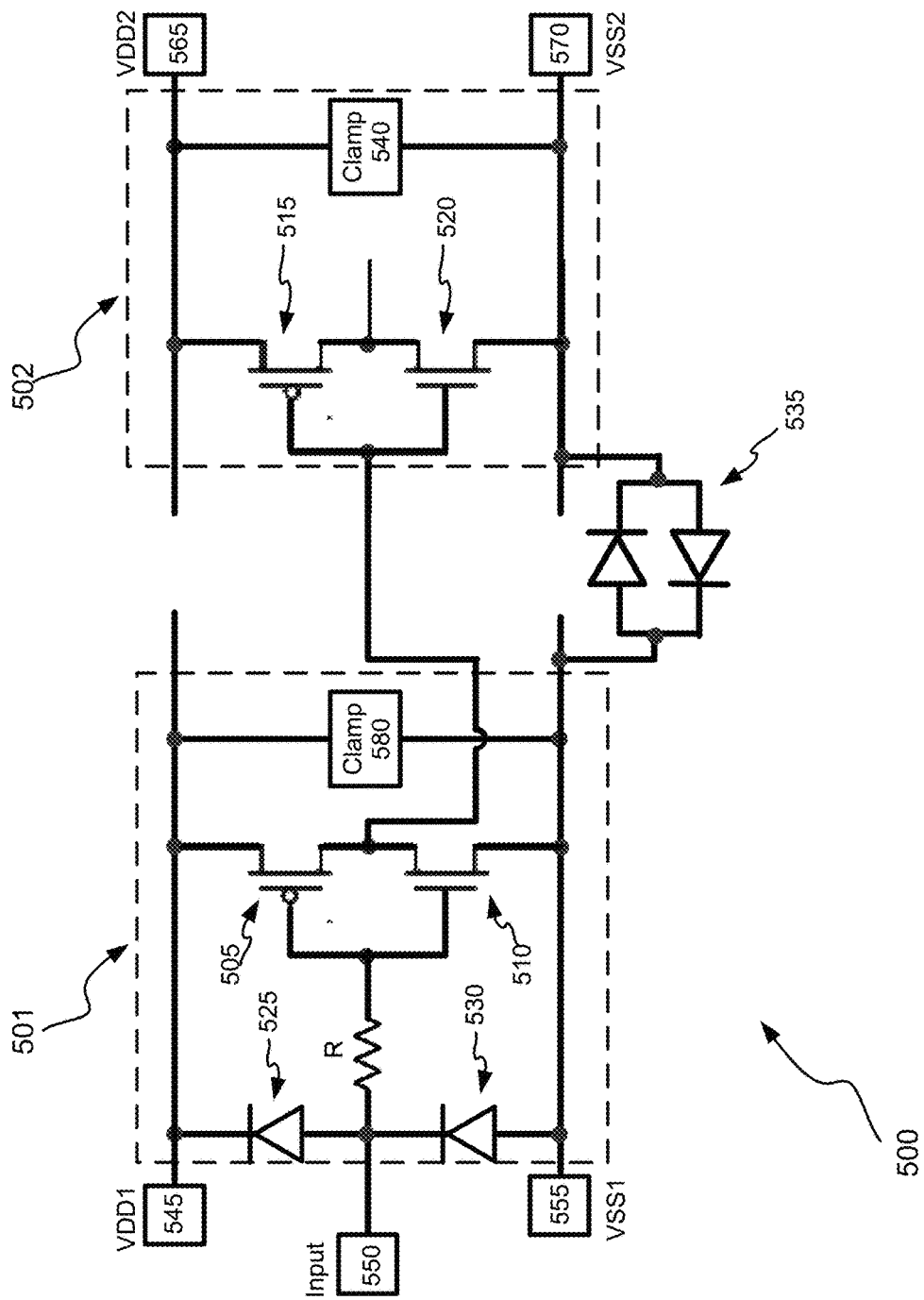
FIG. 5 illustrates a circuit design 500 with ESD protection circuitry added, which is used as an example to describe the ESD protection devices and I/O (input/output) circuitry

FIG. 5 illustrates a circuit design 500 containing ESD protection circuitry, which is used as an example to describe the ESD protection devices and I/O (input/output) circuitry identification process that may be employed according to various embodiments of the disclosed technology. The circuit design 500 includes two power domains: a power domain 501 of which power/ground rails are connected to VDD1 (545) pad and VSS1 (555) pad, respectively, and a power domain 502 of which power/ground rails are connected to VDD2 (565) pad and VSS2 (570) pad, respectively.

In the power domain 501, gates of transistors 505 and 510, representing functional circuitry, are coupled to an input pad 550. Diodes 525 and 530 are ESD protection devices, which can protect the gates of the transistors 505 and 510 from ESD discharges by shunting any positive ESD discharge to VDD1 (545) and any negative ESD discharge to VSS1 (555). Another ESD protection device is a power clamp 580, which provide a further discharge path between VDD1 (545) and VSS1 (555) for any positive charge to VSS1 (555) or any negative discharge to VDD1 (545). The input pad 550, the diode 525, the power clamp 580 and the VSS1 pad 555 forms in series a critical discharge path while the input pad 550, the diode 530, the power clamp 580 and the VDD1 pad 545 forms in series another critical discharge path.

In the power domain 502, gates of transistors 515 and 520, representing functional circuitry, are coupled to the output of the power domain 501. Only one power clamp 540 is shown in the figure. An ESD device 535, formed by two anti-parallel diodes, provides an interdomain ESD protection path.

The circuit topology recognition unit 310 may identify the ESD protection devices (525, 530, 580, 535 and 540) based on design pattern matching. The I/O circuitry can be identified based on various ESD discharge paths formed by these ESD protection devices, the I/O pad (550) and the power supply pads (545, 555, 565 and 570).

Figure 6:
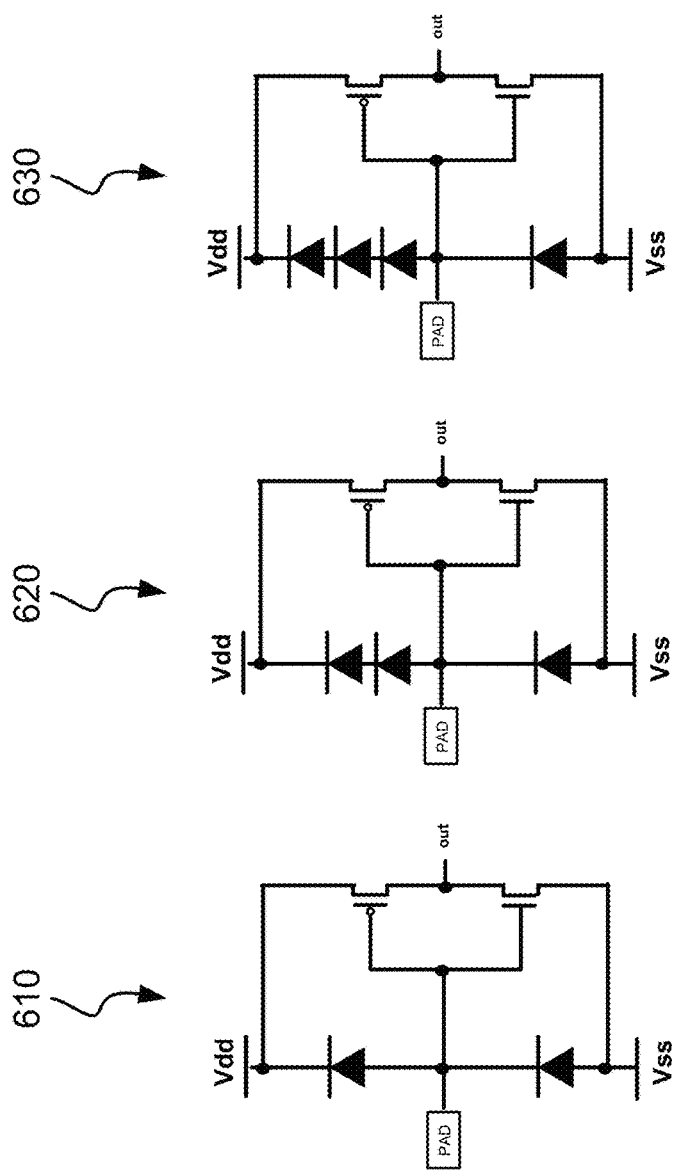
FIG. 6 illustrates an example of three design variations for the ESD protection circuit consisting of two diodes connected to the input pad and the power supply busses as shown in FIG. 5.
Figure 7:
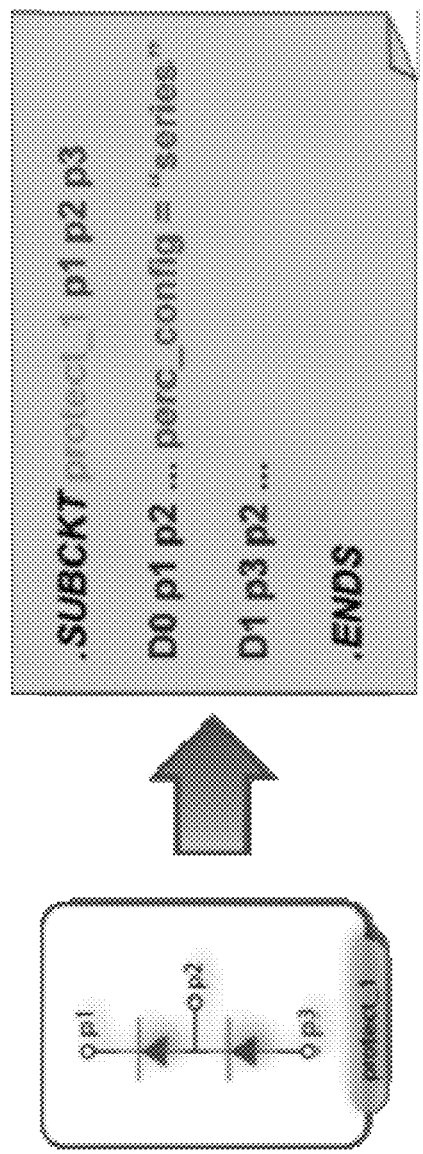
FIG. 7 illustrates an example of a configurable pattern that may be employed to identify the design variations of the ESD protection circuit shown in FIG. 6 according to some embodiments of the disclosed technology.

FIG. 6 illustrates an example of three design variations for the ESD protection circuit consisting of two diodes connected to the input pad and the power supply busses as shown in FIG. 5. Design pattern 610 is the same as the two diodes 525 and 530 in FIG. 5: one diode each between the input pad and the power pad and between the input pad and the ground pad. Design pattern 620 uses a series of two diodes between the input pad and the power pad, while design pattern 630 uses a series of three diodes between the input pad and the power pad. To save time and effort, the circuit topology recognition unit 310 may define an optional configuration or configurable pattern which permits the "up" diode device (i.e., the device between the input pad and the power pad) to be a series of devices in the pattern template. By making the template more flexible, one pattern template can be used to identify all three designs. FIG. 7 illustrates an example of such a pattern template. The parameters in a configurable pattern can identify a range of circuit configurations, such as any number of multiple diodes coupled in series, which all can correspond to a diode-based ESD device.

In operation 420 of the flowchart 400, the circuit simulation unit 320 performs static simulation on the I/O circuitry to determine voltage and current information for devices on current paths in the I/O circuitry based on point-to-point resistance values. The current paths comprise the ESD discharge paths extracted in the previous operation. As discussed previously, the input pad 550, the diode 525, the power clamp 580 and the VSS1 pad shown in FIG. 5 forms in series a discharge path. Similarly, the VDD1 pad 545, the power clamp 580, the ESD device 535 and a master ground bus (not shown in the figure) forms in series another ESD discharge path.

Based on the cross-reference information between circuit component identifiers and layout features, the extracted paths found in the logic circuit design can be mapped to layout data. Resistance between any two points (such as devices) can then be extracted by the parasitic extraction unit 330.

Depending on the size of the circuit block and the granularity of the parasitic elements, a back-annotated netlist can easily reach a file size of several 10's of GB, which is very difficult to handle even for today's hardware and causes a large increase in runtime. In general the overwhelming number of circuit elements is irrelevant for the ESD evaluation which provides an opportunity to reduce the netlist. The ESD verification tool 300 may employ the techniques of connectivity-aware reduction of layout data described in U.S. patent application Ser. No. 14/663,275, which is incorporated herein by reference, to speed up the point-to-point resistance extraction process.

With this information local current densities, but also overall voltage drops in the metal grid can be derived by a simulator. A conventional SPICE simulation tool may be employed by the circuit simulation unit 320.

In operation 430 of the flowchart 400, the circuit simulation unit 320 performs transient simulation on one or more of the ESD protection devices in the devices based on the voltage and current information derived in the previous operation and detailed parasitic information. As discussed previously, the one or more of the ESD protection devices can be mapped to layout data based on the cross-reference information between circuit component identifiers and layout features. The parasitic extraction unit 330 can perform parasitic extraction on the relevant layout data. Unlike the operation 420, not only parasitic resistance but also other parasitic effects such as capacitance are also extracted due to the nature of transient simulation. A conventional SPICE simulation tool can be employed for such simulation. The device models for ESD may be different from standard models used for small signals, however.

In operation 440, the ESD analysis unit 340 analyzes results of the transient simulation to identify ESD protection problems. Some ESD protection devices have a multi-finger structure. The ESD analysis unit 340 may analyze turn-on sequences of multi-finger devices in an ESD protection device. If the turn-on sequences are unbalanced, the discharge current can burn the ESD protection device. The transient simulation results can also be used to identify other ESD protection problems, e.g., time-domain checks.

In operation 450, the ESD verification tool 300 reports the detected ESD protection problems in the circuit design. The reporting may comprise storing and/or displaying information of the detected ESD protection problems. The ESD verification tool 300 (or the graph unit 350) may annotate the graphical representation of the circuit design with indications of ESD protection problems, for example, which can identify a location of the ESD protection problems, the corresponding rule prompting the ESD protection problems, or the like. In some embodiments, the graph display unit 350 may display the annotated graphical representation of the circuit design on a display device.

CONCLUSION

While the disclosed technology has been described with respect to specific examples such as the ESD protection circuitry including presently preferred modes of carrying out the disclosed technology, those skilled in the art will appreciate that there are numerous variations and permutations of the above described systems and techniques that fall within the spirit and scope of the disclosed technology as set forth in the appended claims. For example, while specific terminology has been employed above to refer to electronic design automation processes, it should be appreciated that various examples of the disclosed technology may be implemented using any desired combination of electronic design automation processes.

What is claimed is:

1. One or more computer-readable media storing computer-executable instructions for causing one or more processors to perform a method, the method comprising:
    identifying ESD (electrostatic discharge) protection devices and I/O (input/output) circuitry in a circuit design, wherein the circuit design comprises a netlist and a layout design;
    performing static simulation on the I/O circuitry to determine voltage and current information for devices on current paths in the I/O circuitry based on point-to-point resistance values, wherein the point-to-point resistance values are extracted based on the layout design;
    performing transient simulation on one or more of the ESD protection devices in the devices based on the voltage and current information and detailed parasitic information, wherein the detailed parasitic information is extracted based on the layout design;

analyzing results of the transient simulation to identify ESD protection problems; and reporting the ESD protection problems by displaying an annotated graphical representation of the circuit design including the ESD protection problems.

2. The one or more computer-readable media recited in claim 1, wherein the current paths comprise ESD discharge paths.

3. The one or more computer-readable media recited in claim 1, wherein the identifying employs design pattern matching.

4. The one or more computer-readable media recited in claim 1, wherein the analyzing comprises analyzing turn-on sequences of multi-finger devices in an ESD protection device.

5. The one or more computer-readable media recited in claim 1, wherein the transient simulation is based on SPICE (Simulation Program with Integrated Circuit Emphasis) simulation.

6. The one or more computer-readable media recited in claim 1, wherein the netlist is derived from a schematic design and the point-to-point resistance values and the detailed parasitic information are extracted based further on cross-reference information between circuit component identifiers and layout features.

7. The one or more computer-readable media recited in claim 1, wherein the netlist is derived from the layout design.

8. A method, executed by at least one processor of a computer, comprising:
   identifying ESD (electrostatic discharge) protection devices and I/O (input/output) circuitry in a circuit design, wherein the circuit design comprises a netlist and a layout design;
   performing static simulation on the I/O circuitry to determine voltage and current information for devices on current paths in the I/O circuitry based on point-to-point resistance values, wherein the point-to-point resistance values are extracted based on the layout design;
   performing transient simulation on one or more of the ESD protection devices in the devices based on the voltage and current information and detailed parasitic information, wherein the detailed parasitic information is extracted based on the layout design;
   analyzing results of the transient simulation to identify ESD protection problems; and
   reporting the ESD protection problems by displaying an annotated graphical representation of the circuit design including the ESD protection problems.

9. The method recited in claim 8, wherein the current paths comprise ESD discharge paths.

10. The method recited in claim 8, wherein the identifying employs design pattern matching.

11. The method recited in claim 8, wherein the analyzing comprises analyzing turn-on sequences of multi-finger devices in an ESD protection device.

12. The method recited in claim 8, wherein the transient simulation is based on SPICE (Simulation Program with Integrated Circuit Emphasis) simulation.

13. The method recited in claim 8, wherein the netlist is derived from a schematic design and the point-to-point resistance values and the detailed parasitic information are extracted based further on cross-reference information between circuit component identifiers and layout features.

14. The method recited in claim 8, wherein the netlist is derived from the layout design.

15. A system comprising:
   one or more processors, the one or more processors programmed to perform a method, the method comprising:
   identifying ESD (electrostatic discharge) protection devices and I/O (input/output) circuitry in a circuit design, wherein the circuit design comprises a netlist and a layout design;
   performing static simulation on the I/O circuitry to determine voltage and current information for devices on current paths in the I/O circuitry based on point-to-point resistance values, wherein the point-to-point resistance values are extracted based on the layout design;
   performing transient simulation on one or more of the ESD protection devices in the devices based on the voltage and current information and detailed parasitic information, wherein the detailed parasitic information is extracted based on the layout design;
   analyzing results of the transient simulation to identify ESD protection problems; and
   reporting the ESD protection problems by displaying an annotated graphical representation of the circuit design including the ESD protection problems.

16. The system recited in claim 15, wherein the current paths comprise ESD discharge paths.

17. The system recited in claim 15, wherein the identifying employs design pattern matching.

18. The system recited in claim 15, wherein the analyzing comprises analyzing turn-on sequences of multi-finger devices in an ESD protection device.

19. The system recited in claim 15, wherein the transient simulation is based on SPICE (Simulation Program with Integrated Circuit Emphasis) simulation.

* * * * *